(12) United States Patent
Gumm

(10) Patent No.: US 6,876,261 B2
(45) Date of Patent: Apr. 5, 2005

(54) PHASE LOCK FOR SYNTHESIZER PHASE REFERENCE OSCILLATOR

(75) Inventor: Linley F. Gumm, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/421,236

(22) Filed: Apr. 21, 2003

(65) Prior Publication Data

US 2004/0207477 A1 Oct. 21, 2004

(51) Int. Cl.[7] ............................................. H03L 7/00
(52) U.S. Cl. ............................ 331/16; 331/18; 331/25; 327/105; 327/106
(58) Field of Search ........................... 331/16, 18, 25; 327/105, 106

(56) References Cited

U.S. PATENT DOCUMENTS 6,198,353 B1 * 3/2001 Janesch et al. ............... 331/16

* cited by examiner

Primary Examiner—Arnold Kinkead
(74) Attorney, Agent, or Firm—Francis I. Gray

(57) ABSTRACT

A phase lock for a synthesizer phase reference oscillator that is used in conjunction with a conventional DDS circuit to synthesize an RF output frequency includes a second DDS circuit that is added with a reference increment value as an input to provide a phase offset frequency. A frequency/phase comparator compares a frequency reference oscillator output with the phase offset frequency to generate a control signal for phase locking the phase reference oscillator to the frequency reference oscillator. To determine the correct value for the reference increment value, a switch is provided between the frequency/phase comparator and the phase reference oscillator and the control signal is input to an analog-to-digital converter. During a "turn on" procedure the resulting digitized control signal is observed by a control system as the reference increment value is adjusted until a slow ramp, positive or negative, in the control signal is observed. Then the switch is closed to allow the control signal to phase lock the phase reference oscillator coherently to the frequency reference oscillator. In this way coherence is achieved from unit to unit with a more precise frequency output.

6 Claims, 2 Drawing Sheets

PHASE LOCK FOR SYNTHESIZER PHASE REFERENCE OSCILLATOR

BACKGROUND OF THE INVENTION

The present invention relates to low phase noise frequency synthesizers, and more particularly to a phase lock for a synthesizer phase reference oscillator for providing an accurate frequency and preventing drift.

When designing low phase noise frequency synthesizers, many oscillators that exhibit low phase noise also drift rapidly or have an initial frequency that is only approximately correct and varies from unit to unit. Further these oscillators often lose their low phase noise characteristics if they are redesigned to electronically tune over a substantial frequency range in order to bring them to a standard frequency value. It should be noted that it is nearly always possible to tune these oscillators over a small frequency range near their initial frequency by some means, be it a heavily de-coupled varactor or by varying the oscillator supply voltage.

A user expects that when two or more such frequency synthesizers share the same frequency reference, their outputs will exhibit phase coherence. An example of phase coherence is that, if set to the same frequency, the phase angle between the two frequency synthesizer outputs remains constant.

Direct digital synthesis (DDS) is illustrated in FIG. 1 where a value D is added to the value in a latch until it exceeds the latch capacity, at which point the value in the latch rolls over. The value in the latch is then the summation of D over time modulo the maximum numeric value of the latch, $2^A$. The latch holds a value proportional to the phase of a sine wave signal being synthesized. Its value is sent to a ROM that converts the phase values into values correct for a sine wave, and then a D/A converter is used to create an analog sine wave out of the numeric representation of one. The DDS output frequency is given by $$F_{out}=F_{in}(D/2^A)$$

where A is the width of the accumulator bus. DDS is well documented—see "A Technical Tutorial on Digital Signal Synthesis" by Analog Devices, available at <http://www.analog.com/technology/dataConverter/dds/tecnical_articles.html>

An example of a DDS system used to transform a phase reference oscillator's frequency to an output frequency signal is shown in FIG. 2. Here, for example, a 300 MHz phase reference oscillator may be designed around a very high quality quartz crystal that exhibits very low phase noise or some other high-Q device. DDS is used to generate an offset frequency signal (3–18 MHz in this example) of very high setability, such as in microHertz steps with an Analog Devices AD9852. The offset signal is used together with the frequency signal from an intermediate frequency oscillator to create another frequency signal (303–318 MHz in this example) that is the sum of the 300 MHz phase reference frequency and the DDS offset frequency signal. The intermediate frequency signal is used to phase lock an RF oscillator to its $N^{th}$ harmonic (4.0–8.0 GHz in this example) via a sampling phase detector. The phase reference frequency may be anywhere from a few Hertz to a few kiloHertz away from exactly 300 MHz, in this example. It will exhibit some frequency change with its supply voltage, called "pulling", or it may have a varactor imbedded in its circuit to allow tuning it over a very narrow frequency range without affecting its phase noise characteristics.

What is desired is a frequency synthesizer circuit arrangement that allows a designer to use the frequency characteristics of low phase noise oscillators while achieving a phase coherent output.

BRIEF SUMMARY OF THE INVENTION

Accordingly the present invention provides a phase lock for a synthesizer phase reference oscillator that is used in conjunction with a conventional DDS circuit to synthesize an RF output frequency. A second DDS circuit is added with a reference increment input to provide a phase offset frequency. A frequency/phase comparator compares a frequency reference oscillator output with the phase offset frequency to generate a control signal for phase locking the phase reference oscillator to the frequency reference oscillator. To determine a correct value for the reference increment value a switch is provided between the frequency/phase comparator and the phase reference oscillator and the control signal is input to an analog-to-digital converter. During a "turn on" procedure the resulting digitized control signal is observed by a control system as the reference increment value is adjusted until a slow ramp, positive or negative, in the control signal is obtained. Then the switch is closed to allow the control signal to phase lock the phase reference oscillator coherently to the frequency reference oscillator. In this way coherence is achieved from unit to unit with a more precise frequency output.

The objects, advantages and other novel features of the present invention are apparent from the following detailed description when read in conjunction with the appended claims and attached drawing.

DETAILED DESCRIPTION OF THE INVENTION

Figure 1:
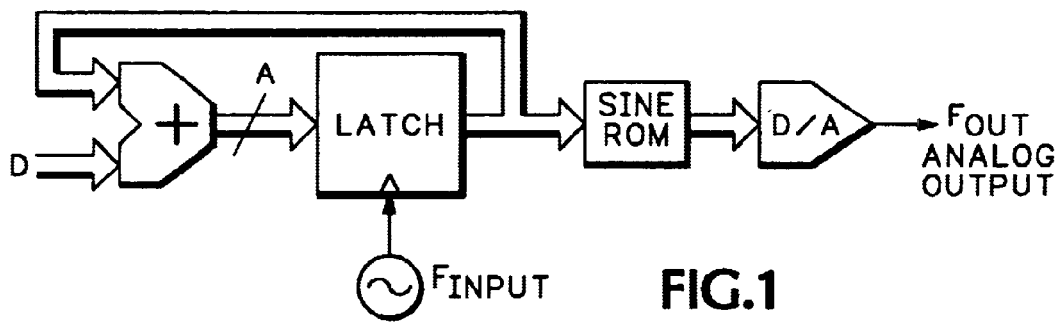
FIG. 1 is a block diagram view illustrating the basic concept of direct digital synthesis (DDS) of a frequency signal according to the prior art.
Figure 2:
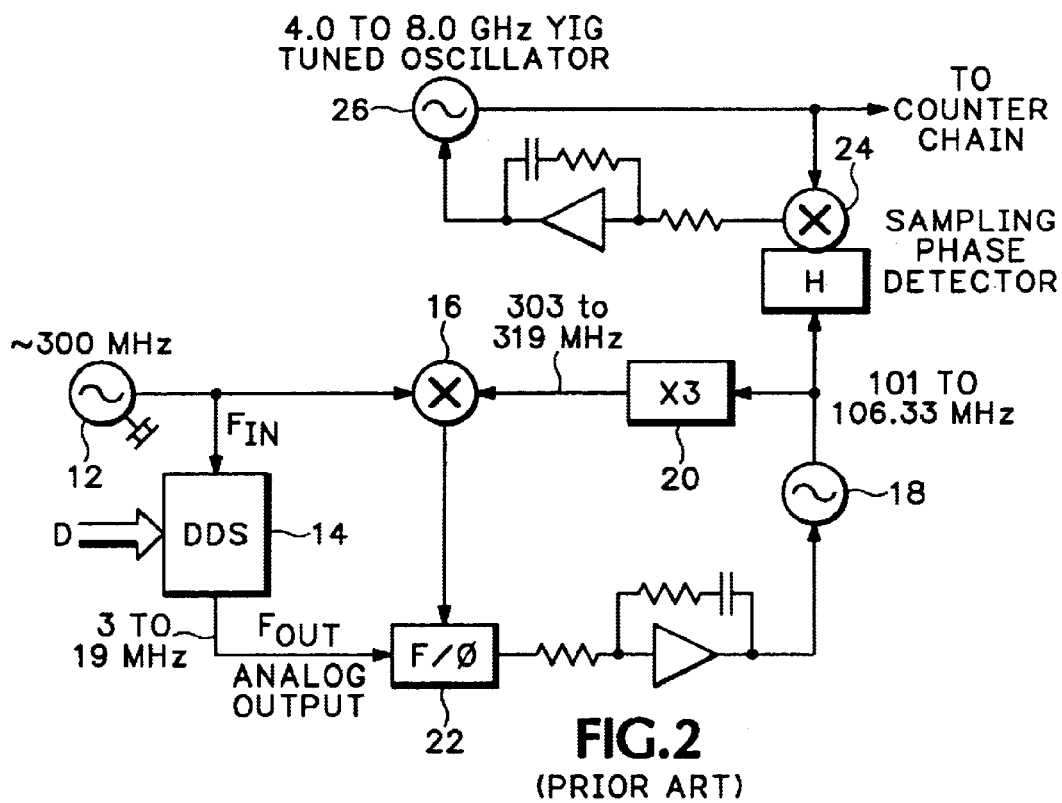
FIG. 2 is a block diagram view of a frequency synthesizer according to the prior art using DDS.
Figure 3:
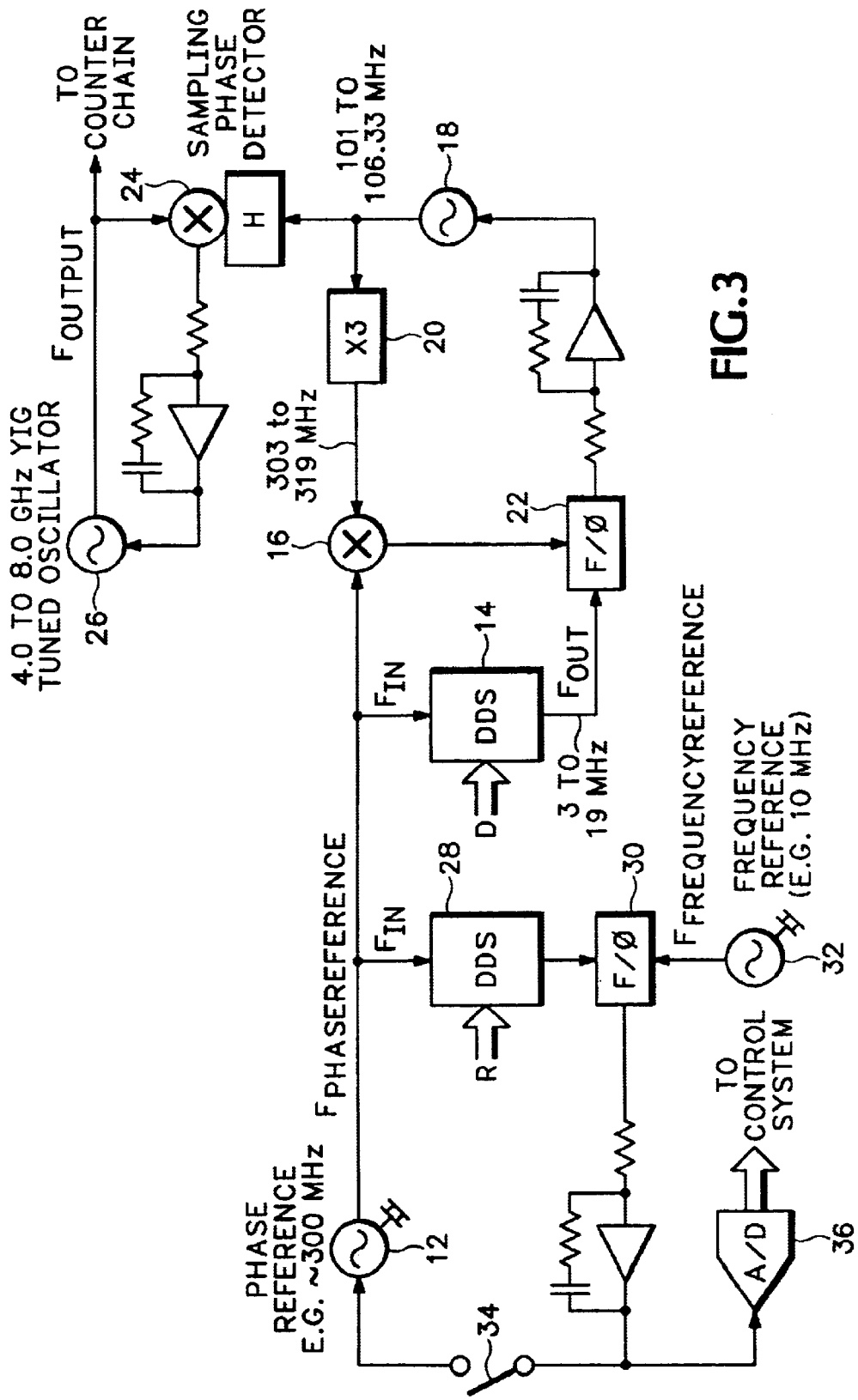
FIG. 3 is a block diagram view of a variable reference frequency synthesizer system according to the present invention.

Referring now to FIG. 3 the frequency output by a phase reference oscillator 12, such as approximately 300 MHz, is input to a conventional DDS circuit 14 having an input value D from a control system and to a first mixer/multiplier 16. The other input to the first mixer/multiplier 16 is an approximate 300 MHz signal from an intermediate frequency oscillator 18 via a frequency multiplier 20. The resulting difference frequency from the mixer/multiplier 16 is compared in a first frequency/phase (F/θ) comparator 22 with the output from the conventional DDS circuit 14 to provide a control signal for the intermediate frequency oscillator 18. The output of the intermediate frequency oscillator 18 also is input to a sampling phase detector 24 which controls an RF oscillator 26 over a wide frequency range, e.g., 4.0 to 8.0 GHz. The output of the RF oscillator 26 is the other input to the sampling phase detector 24, and also may be applied to a counter chain, for example. This is the same as the DDS frequency synthesizer shown in FIG. 2.

The output from the phase reference oscillator 12 also is input to a phase DDS circuit 28 having a reference increment value R input from the control system. The output from the phase DDS circuit 28 is input to a second F/θ comparator 30 together with the output of a frequency reference oscillator 32. The resulting control signal from the second F/θ comparator 30 is applied to the phase reference oscillator 12 via a switch 34 and provided via an A/D converter 36 to the control system. The phase DDS circuit 28 is used to measure the phase reference frequency, then phase lock it to the frequency reference.

Upon "turn on" with the switch 34 open, the control system manipulates the reference increment value R input to the phase DDS circuit 28 while measuring the control voltage output at the A/D converter 36. When R is correctly chosen, the voltage at the A/D converter 36 is a slow ramp, either positive or negative. The switch 34 is then closed, phase locking the phase reference oscillator 12 to the frequency reference oscillator 32. These two oscillators 12, 32 are now coherent. The value of R is then used to offset the value of D to obtain a correct synthesizer output frequency. For this frequency synthesizer the output frequency is:

$$F_{Output} = F_{PhaseReference}(1+D/2^A)(N/3)$$

But $$F_{PhaseReference} = (2^A/R) F_{FrequencyReference}$$

Then $$F_{Output} = ((D+2^A)/R)(N/3) F_{FrequencyReference}$$

Once R is found by the "turn on" procedure, the D required for any desired output frequency may be quickly determined. A similar equation may be found for other frequency synthesizer topologies.

This concept applies to all frequency synthesizers that use a DDS as part of the synthesis process and is not limited to the example illustrated here.

Thus the present invention provides a phase lock for a frequency synthesizer phase reference oscillator that achieves a phase coherent output by using a second DDS to lock the phase reference oscillator to a frequency reference oscillator.

What is claimed is:

1. An improved apparatus for synthesizing a frequency signal of the type having a phase reference oscillator with an output coupled to an input of a direct digital synthesis (DDS) circuit for generating the frequency signal from an output oscillator using a phase locked loop wherein the improvement comprises means for phase locking the phase reference oscillator to a frequency reference oscillator to generate a phase correction frequency from the output of the phase reference oscillator which provides phase coherent output from the phase reference oscillator.

2. The improved apparatus as recited in claim 1 wherein the phase locking means comprises:
   a second DDS circuit receiving an output from the phase reference oscillator and a reference increment value to produce the phase correction frequency; and
   means for comparing the phase correction frequency with an output from the frequency reference oscillator to produce a control signal for the phase reference oscillator.

3. The improved apparatus as recited in claim 2 wherein the phase locking means further comprises:
   a switch for coupling the control signal to the phase reference oscillator; and
   means for adjusting the reference increment value by monitoring the control signal during a "turn on" procedure before the control signal is applied to the phase reference oscillator via the switch.

4. The improved apparatus as recited in claim 3 wherein the adjusting means comprises means for determining that the reference increment value is correct when the control signal is a slow ramp.

5. A method of generating a frequency signal using a phase reference oscillator with an output coupled to an input of a direct digital synthesis (DDS) circuit for generating the frequency signal from an output oscillator using a phase locked loop comprising the steps of:
   generating a phase correction frequency from an output of the phase reference oscillator using a second DDS circuit having a reference increment value as an input; and
   comparing the phase correction frequency with an output of a frequency reference oscillator to produce a control signal for the phase reference oscillator that phase locks the phase reference oscillator to the frequency reference oscillator.

6. The method as recited in claim 5 further comprising the step of determining the reference increment value from the control signal during a "turn on" procedure prior to applying the control signal to the phase reference oscillator.

\* \* \* \* \*